(12) United States Patent
Luo et al.

(10) Patent No.: US 6,417,734 B1
(45) Date of Patent: Jul. 9, 2002

(54) HIGH-FREQUENCY AMPLIFIER CIRCUIT WITH NEGATIVE IMPEDANCE CANCELLATION

(75) Inventors: Sifen Luo, Hartsdale; Tirdad Sowlati, Ossining, both of NY (US)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/603,875

(22) Filed: Jun. 26, 2000

(51) Int. Cl.$^7$ .................................................. H03F 3/04
(52) U.S. Cl. ........................ 330/296; 330/288; 330/310; 330/311; 333/213
(58) Field of Search ................................ 330/288, 296, 330/311, 310; 333/213

(56) References Cited

U.S. PATENT DOCUMENTS

| | | | | |
|---|---|---|---|---|
| 3,906,386 A | * | 9/1975 | Hongu et al. | 330/296 |
| 4,686,387 A | * | 8/1987 | Rumelhard | 330/296 |
| 5,424,686 A | | 6/1995 | Wong et al. | 330/302 |
| 5,828,269 A | | 10/1998 | Wong et al. | 330/275 |
| 5,945,879 A | * | 8/1999 | Rodwell et al. | 330/310 |

FOREIGN PATENT DOCUMENTS

JP 4079407 * 3/1992 ................. 330/296

OTHER PUBLICATIONS

Millman "Microelectronics Digital and Analog Circuits and Systems" McGraw–Hill Book Company 1979 pp. 538–539.*

* cited by examiner

*Primary Examiner*—Michael B Shingleton
(74) *Attorney, Agent, or Firm*—Steven R. Biren

(57) ABSTRACT

A high-frequency amplifier circuit includes an amplifying transistor and a driver transistor, with the amplifying transistor being connected in either a common emitter or a common source configuration and the driver transistor being connected in a corresponding common collector or a common drain configuration, depending upon whether bipolar or field effect transistors are used. A current-mirror bias circuit is coupled between an input terminal and an output terminal of the driver transistor, with a resistor being provided for coupling the current mirror to the input terminal of the driver transistor. The resistor, which typically has a value of between about 20 and 100 ohms, provides a negative impedance cancellation effect while minimizing power consumption at low bias levels.

5 Claims, 2 Drawing Sheets

HIGH-FREQUENCY AMPLIFIER CIRCUIT WITH NEGATIVE IMPEDANCE CANCELLATION

BACKGROUND OF THE INVENTION

The invention is in the field of transistor amplifier circuits, and relates more particularly to high-frequency amplifier circuits.

Amplifiers of this general type are frequently used in high-frequency RF amplifiers, such as those used in wireless communications apparatus. Typically, the output stage of such a high-frequency amplifier circuit uses a common emitter bipolar transistor or a common source field effect transistor, which is biased with either a voltage source or a current source at its input. The output stage is typically fed by a buffer or driver stage employing a driver transistor connected in a common collector (emitter follower) configuration for a bipolar transistor or a common drain (source follower) configuration for a field effect transistor. Buffer or driver stages of this type are typically used to increase the overall gain of the circuit and to increase the input impedance of the common emitter or common source output stage.

However, amplifier circuits employing an amplifying transistor in conjunction with a driver transistor in the configurations discussed above will typically generate a negative impedance at certain high frequencies due to circuit capacitances.

This problem has been recognized previously, and representative prior-art techniques (one of which was developed by a co-inventor herein) are illustrated in U.S. Pat. Nos. 5,424,686 and 5,828,269.

However, prior-art techniques using a resistor to compensate for the negative impedance have the drawback that the compensation resistor consumes power whenever the buffer amplifier is biased. Accordingly, it would be desirable to have a high-frequency amplifier circuit in which a resistive negative impedance cancellation effect is provided, and in which power consumption, particularly under low bias conditions, is minimized.

SUMMARY OF THE INVENTION

It is therefore an object of the present invention to provide a high-frequency amplifier circuit in which a resistive negative impedance cancellation effect is obtained in conjunction with reduced power consumption, particularly under low bias conditions.

In accordance with the invention, this object is achieved by a new high-frequency amplifier circuit including an amplifying transistor and a driver transistor, with the amplifying transistor being connected in one of a common emitter and a common source configuration and the driver transistor being connected in one of a common collector and a common drain configuration. A current-mirror bias circuit is coupled between an input terminal of the driver transistor and an output terminal of the driver transistor, and a resistor for coupling the current mirror to the input terminal of the driver transistor is provided to achieve a negative impedance cancellation effect.

In a preferred embodiment of the invention, the amplifying transistor, the driver transistor and the transistors forming the current-mirror bias circuit are all bipolar transistors, while in a further preferred embodiment all of these transistors are field effect transistors.

In yet a further preferred embodiment of the invention, the resistor for coupling the current mirror to the input terminal of the driver transistor may have a value of between about 20 and about 100 ohms.

A high-frequency amplifier circuit in accordance with the present invention offers a significant improvement in that a negative impedance cancellation effect is provided while power consumption, particularly under low-bias conditions, is reduced, in an economical and easily-implemented configuration.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

In the drawing, like reference numerals are generally used to designate like components.

DESCRIPTION OF THE PREFERRED EMBODIMENTS

Figure 1:
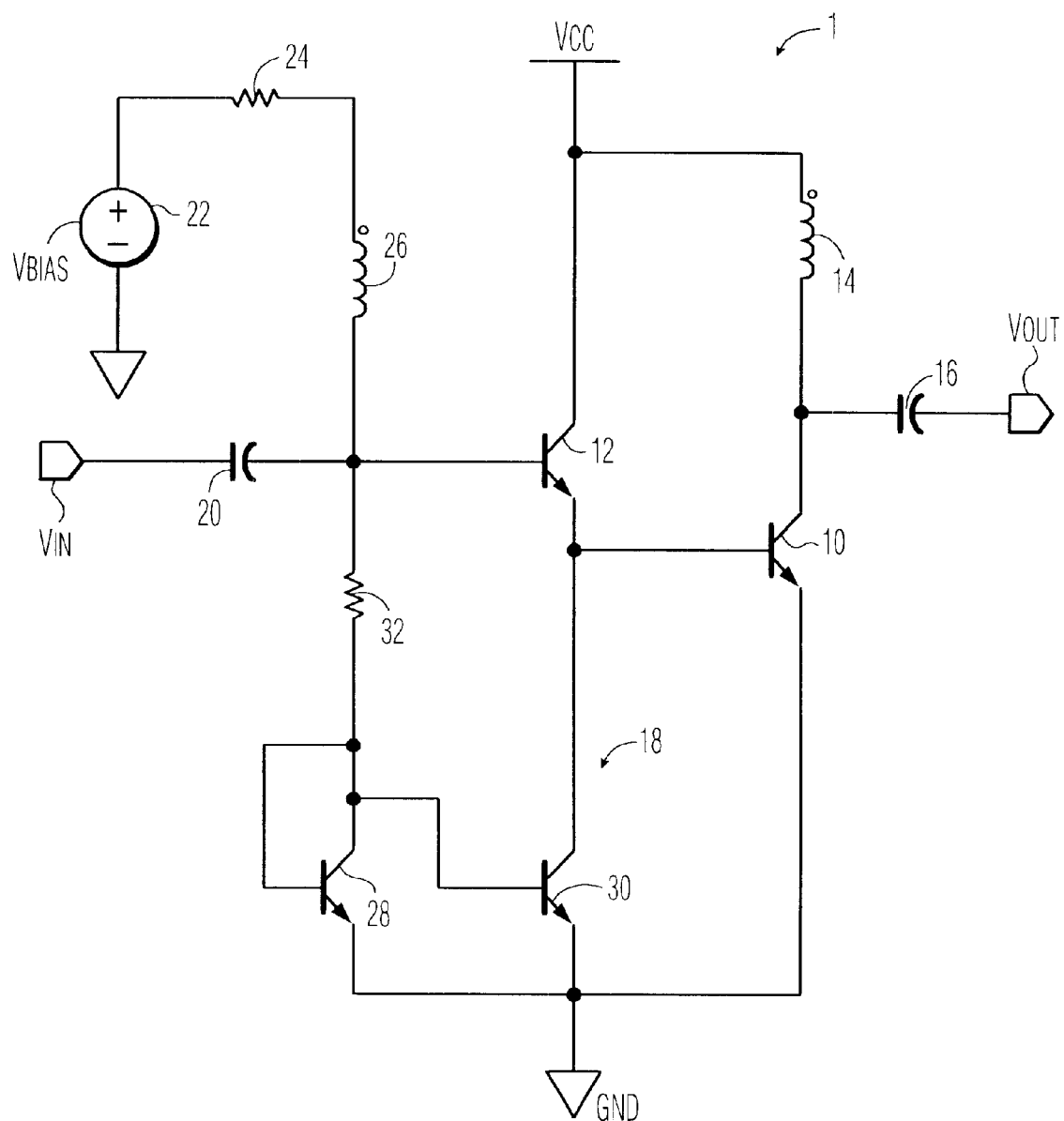
FIG. 1 shows a simplified schematic diagram of a high-frequency amplifier circuit in accordance with a first embodiment of the invention.

A simplified schematic diagram of a high-frequency amplifier circuit 1 in accordance with a first embodiment of the invention is shown in FIG. 1. The amplifier circuit includes an amplifying transistor 10 which is driven by a driver transistor 12, with the amplifying transistor being connected in a common emitter configuration and the driver transistor being connected in a common collector (emitter follower) configuration. Both the amplifying transistor and the driver transistor are coupled between a voltage source $V_{CC}$ and ground (GND). The collector of transistor 10 is coupled to $V_{CC}$ by an inductor 14 and provides an output signal at terminal $V_{OUT}$ though a coupling capacitor 16. Driver transistor 12 has its collector connected directed to $V_{CC}$ and its emitter connected to both the base of amplifying transistor 10 and the output of current mirror 18, which is described in further detail below. An input signal to the high-frequency amplifier circuit 1 is provided to the base of transistor 12 from input terminal $V_{IN}$ through an input coupling capacitor 20.

The simplified circuit of FIG. 1 is completed by a bias circuit comprising a bias voltage source 22, which provides a bias voltage $V_{BIAS}$ to a series connection of a resistor 24 and an inductor 26, with the latter being connected to the base of driver transistor 12. The bias portion of the circuit is completed by current mirror 18, which comprises transistors 28 and 30, and in accordance with the invention a resistor 32 is provided to couple the base of transistor 12 to the input of the current mirror at the collector of transistor 28 and base of transistor 30, with the output of the current mirror 18, at the collector of transistor 30, being connected to the emitter of transistor 12 and the base of transistor 10.

In accordance with the invention, negative impedance cancellation is provided by employing resistor 32 in conjunction with current mirror 18 in the bias circuit. Since the supply voltage provided to the current mirror 18, at the top end of resistor 32, is equal to the bias voltage at the base of the driver transistor 12, resistor 32 does not consume power under low bias conditions.

In this manner, resistor 32 provides a dual function, in that it not only affords negative impedance cancellation, but also determines the reference current for the current mirror 18. Under low bias voltage conditions at the base of transistor 12, there will be insufficient voltage to activate the current mirror, so that there will be no current flowing through resistor 32 and no power dissipated therein.

When the common collector/common emitter amplifier circuit (12, 10) presents a negative resistance at the base of transistor 12, resistor 32 together with the impedance of diode-connected transistor 28 will cancel out the negative resistance as long as the combined equivalent shunt resistance of resistor 32 and transistor 28 is smaller than the negative resistance of the common collector/common emitter amplifier circuit. It has been found that this can typically be accomplished by providing resistor 32 with resistance values of between about 20 ohms and about 100 ohms, depending upon the particular circuit application and component characteristics.

Figure 2:
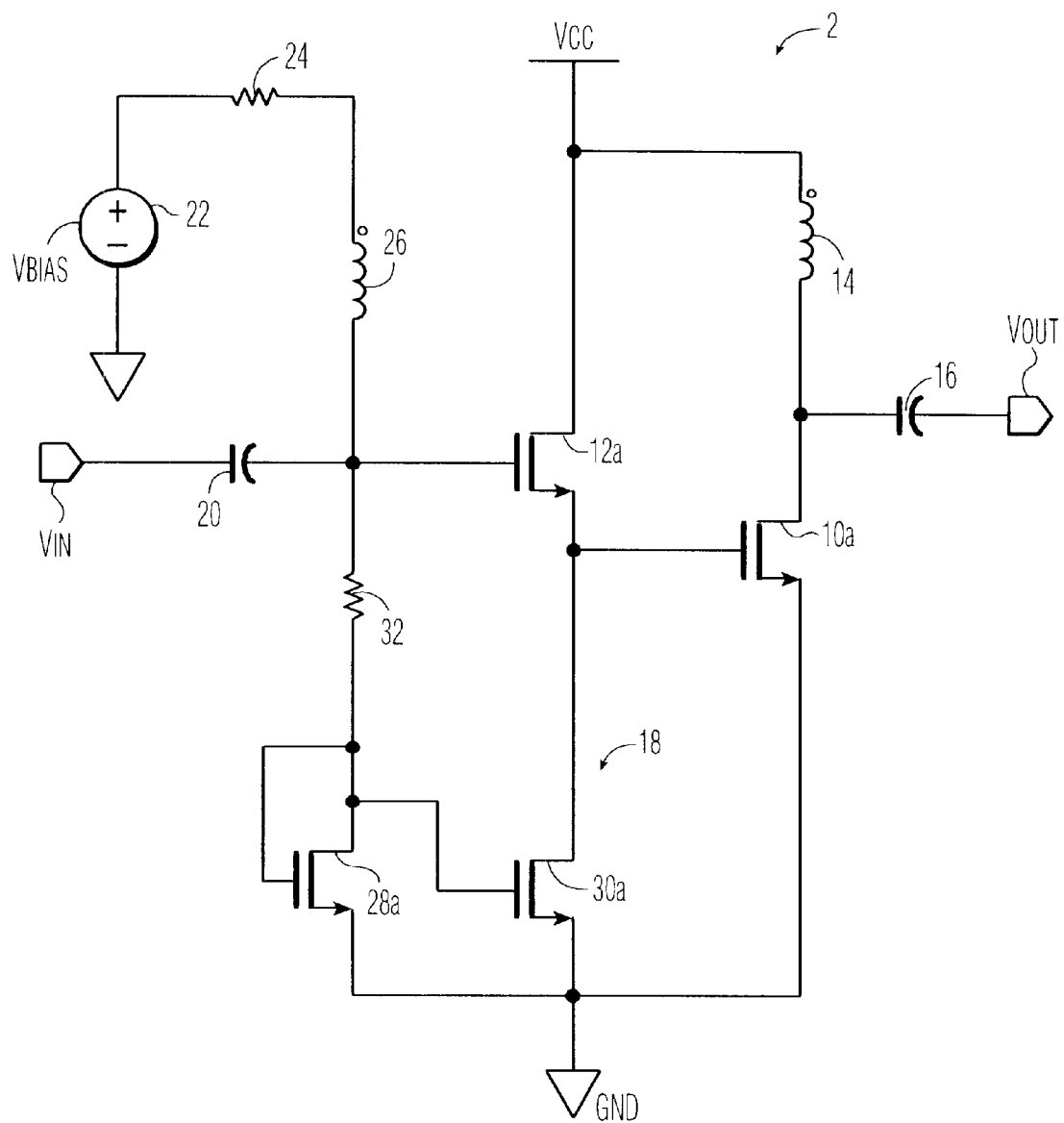
FIG. 2 shows a simplified schematic diagram of a high-frequency amplifier circuit in accordance with a second embodiment of the invention.

A high-frequency amplifier circuit 2, in accordance with a second embodiment of the invention, is shown in simplified schematic form in FIG. 2. The general circuit configuration shown in FIG. 2 is the same as that shown in FIG. 1, with like reference numerals being used to designate like components, and accordingly the similar portions of FIG. 2 will not be described in further detail. FIG. 2 differs from FIG. 1 in that all of the active components which were bipolar transistors in FIG. 1 (10, 12, 28, 30) have been replaced by MOS field effect transistors in FIG. 2, with the circuit being otherwise identical. For clarity, the four transistors corresponding to bipolar transistors 10, 12, 28 and 30 in FIG. 1 have been shown and designated as MOS field effect transistors 10a, 12a, 28a and 32a in FIG. 2.

In this manner, the present invention provides a high-frequency amplifier circuit in which a negative impedance cancellation effect is achieved, and in which power consumption is reduced under low bias conditions. Additionally, economy of manufacture is achieved in that the same resistor provides negative impedance cancellation and also determines the reference current for the current mirror portion of the circuit.

While the invention has been particularly shown and described with reference to several preferred embodiments thereof, it will be understood by those skilled in the art that various changes in form and detail may be made without departing from the spirit or scope of the invention. Thus, for example, different types of transistors may be employed, and alterations to the circuit configuration may be made to suit particular design requirements.

What is claimed is:

1. A high-frequency amplifier circuit comprising an amplifying transistor and a driver transistor, the amplifying transistor being connected in one of a common emitter and a common source configuration and the driver transistor being connected in a corresponding one of a common collector and a common drain configuration, a current-mirror bias circuit connected directly to a common terminal and coupled between an input terminal of said driver transistor and an output terminal of said driver transistor, and a resistor connected directly in series with an input terminal of said current mirror for directly connecting said current mirror to said input terminal of said driver transistor through said resistor.

2. A high-frequency amplifier circuit as in claim 1, wherein the amplifying transistor is a bipolar transistor connected in a common emitter configuration, the driver transistor is a bipolar transistor connected in a common collector configuration, and the current-mirror bias circuit comprises bipolar transistors.

3. A high-frequency amplifier circuit as in claim 1, wherein the amplifying transistor is a field effect transistor connected in a common source configuration, the driver transistor is a field effect transistor connected in a common drain configuration, and the current-mirror bias circuit comprises field effect transistors.

4. A high-frequency amplifier circuit as in claim 1, wherein said resistor has a value of between about 20 and about 100 ohms.

5. A high-frequency amplifier circuit as in claim 1, wherein said resistor provides a negative impedance cancellation effect.

* * * * *